(12) United States Patent
Shokrollahi et al.

(10) Patent No.: US 11,368,247 B2
(45) Date of Patent: *Jun. 21, 2022

(54) MULTI-WIRE PERMUTED FORWARD ERROR CORRECTION

(71) Applicant: Kandou Labs SA, Lausanne (CH)

(72) Inventors: Amin Shokrollahi, Préverenges (CH); Ali Hormati, Ecublens Vaud (CH)

(73) Assignee: KANDOU LABS, S.A., Lausanne (CH)

( * ) Notice: Subject to any disclaimer, the term of this patent is extended or adjusted under 35 U.S.C. 154(b) by 63 days.

This patent is subject to a terminal disclaimer.

(21) Appl. No.: 16/909,525

(22) Filed: Jun. 23, 2020

(65) Prior Publication Data

US 2020/0336244 A1  Oct. 22, 2020

Related U.S. Application Data

(63) Continuation of application No. 16/031,877, filed on Jul. 10, 2018, now Pat. No. 10,693,587.

(Continued)

(51) Int. Cl.
*H03M 13/00* (2006.01)
*H04L 1/00* (2006.01)
(Continued)

(52) U.S. Cl.
CPC .......... *H04L 1/0041* (2013.01); *H03M 13/05* (2013.01); *H03M 13/1515* (2013.01);
(Continued)

(58) Field of Classification Search
CPC .... H04L 1/0041; H04L 1/0071; H03M 13/05; H03M 13/1515; H03M 13/27; H03M 13/3761
See application file for complete search history.

(56) References Cited

U.S. PATENT DOCUMENTS 3,196,351 A  7/1965 David
3,629,824 A  12/1971 Bossen
(Continued)

FOREIGN PATENT DOCUMENTS

CN  1671092 A  9/2005
CN  1864346 A  11/2006
(Continued)

OTHER PUBLICATIONS

Nada, Tadahiro, et al., "A Study on Orthogonal Multi-Code CDMA Systems Using Constant Amplitude Coding", Technical Report of IEICE, vol. 97, No. 132, Jun. 24, 1997, 19-24 (6 pages).
(Continued)

*Primary Examiner* — Esaw T Abraham
(74) *Attorney, Agent, or Firm* — Invention Mine LLC

(57) ABSTRACT

Methods and systems are described for obtaining a plurality of information bits, and responsively partitioning the obtained plurality of information bits into a plurality of subsets of information bits, generating a plurality of streams of forward error correction (FEC)-encoded bits using a plurality of FEC encoders receiving respective subsets of the plurality of subsets of information bits, providing the plurality of streams of FEC-encoded bits to a plurality of sub-channel encoders, each sub-channel encoder receiving a respective stream of FEC-encoded bits from a different FEC encoder of the plurality of FEC encoders for generating a set of codewords of a vector signaling code, and wherein sequential streams of FEC-encoded bits from a given FEC encoder are provided to different sub-channel encoders for each successively generated set of codewords, and transmitting the successively generated sets of codewords of the vector signaling code over a multi-wire bus.

20 Claims, 12 Drawing Sheets

Related U.S. Application Data

(60) Provisional application No. 62/530,809, filed on Jul. 10, 2017.

(51) Int. Cl.
*H04L 25/02* (2006.01)
*H03M 13/05* (2006.01)
*H04J 13/00* (2011.01)
*H04L 25/08* (2006.01)
*H03M 13/15* (2006.01)
*H03M 13/37* (2006.01)
*H03M 13/27* (2006.01)

(52) U.S. Cl.
CPC ....... *H03M 13/27* (2013.01); *H03M 13/3761* (2013.01); *H03M 13/6561* (2013.01); *H04J 13/004* (2013.01); *H04L 1/0071* (2013.01); *H04L 25/0272* (2013.01); *H04L 25/085* (2013.01)

(56) References Cited

U.S. PATENT DOCUMENTS

| | | |
|---|---|---|
| 3,965,418 A | 6/1976 | Bauer et al. |
| 3,970,795 A | 7/1976 | Allen |
| 4,112,264 A | 9/1978 | Abramson et al. |
| 4,163,258 A | 7/1979 | Ebihara et al. |
| 4,486,739 A | 12/1984 | Franaszek et al. |
| 4,499,550 A | 2/1985 | Ray et al. |
| 4,772,845 A | 9/1988 | Scott |
| 4,864,303 A | 9/1989 | Ofek |
| 5,053,974 A | 10/1991 | Penz |
| 5,166,956 A | 11/1992 | Baltus et al. |
| 5,168,509 A | 12/1992 | Nakamura et al. |
| 5,311,516 A | 5/1994 | Kuznicki et al. |
| 5,331,320 A | 7/1994 | Cideciyan et al. |
| 5,412,689 A | 5/1995 | Chan et al. |
| 5,449,895 A | 9/1995 | Hecht et al. |
| 5,553,097 A | 9/1996 | Dagher |
| 5,566,193 A | 10/1996 | Cloonan |
| 5,825,808 A | 10/1998 | Hershey et al. |
| 5,856,935 A | 1/1999 | Moy et al. |
| 5,875,202 A | 2/1999 | Venters et al. |
| 5,881,130 A | 3/1999 | Zhang |
| 5,982,954 A | 11/1999 | Delen et al. |
| 6,005,895 A | 12/1999 | Perino et al. |
| 6,084,883 A | 7/2000 | Norrell et al. |
| 6,084,958 A | 7/2000 | Blossom |
| 6,097,732 A | 8/2000 | Jung |
| 6,111,895 A | 8/2000 | Miller et al. |
| 6,119,263 A | 9/2000 | Mowbray et al. |
| 6,128,330 A | 10/2000 | Schilling |
| 6,154,498 A | 11/2000 | Dabral et al. |
| 6,175,230 B1 | 1/2001 | Hamblin et al. |
| 6,188,497 B1 | 2/2001 | Franck et al. |
| 6,226,330 B1 | 5/2001 | Mansur |
| 6,278,740 B1 | 8/2001 | Nordyke |
| 6,317,465 B1 | 11/2001 | Akamatsu et al. |
| 6,359,931 B1 | 3/2002 | Perino et al. |
| 6,404,820 B1 | 6/2002 | Postol |
| 6,452,420 B1 | 9/2002 | Wong |
| 6,473,877 B1 | 10/2002 | Sharma |
| 6,483,828 B1 | 11/2002 | Balachandran et al. |
| 6,504,875 B2 | 1/2003 | Perino et al. |
| 6,556,628 B1 | 4/2003 | Poulton et al. |
| 6,621,427 B2 | 9/2003 | Greenstreet |
| 6,621,945 B2 | 9/2003 | Bissessur |
| 6,650,638 B1 | 11/2003 | Walker et al. |
| 6,661,355 B2 | 12/2003 | Cornelius et al. |
| 6,690,739 B1 | 2/2004 | Mui |
| 6,766,342 B2 | 7/2004 | Kechriotis |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,954,492 B1 | 10/2005 | Williams |
| 6,963,622 B2 | 11/2005 | Eroz et al. |
| 6,973,613 B2 | 12/2005 | Cypher |
| 6,976,194 B2 | 12/2005 | Cypher |
| 6,982,954 B2 | 1/2006 | Dhong et al. |
| 6,990,138 B2 | 1/2006 | Bejjani et al. |
| 6,999,516 B1 | 2/2006 | Rajan |
| 7,023,817 B2 | 4/2006 | Kuffner et al. |
| 7,039,136 B2 | 5/2006 | Olson et al. |
| 7,057,546 B1 | 6/2006 | Secatch et al. |
| 7,075,996 B2 | 7/2006 | Simon et al. |
| 7,080,288 B2 | 7/2006 | Ferraiolo et al. |
| 7,082,557 B2 | 7/2006 | Schauer et al. |
| 7,127,003 B2 | 10/2006 | Rajan et al. |
| 7,142,612 B2 | 11/2006 | Horowitz et al. |
| 7,167,523 B2 | 1/2007 | Mansur |
| 7,180,949 B2 | 2/2007 | Kleveland et al. |
| 7,184,483 B2 | 2/2007 | Rajan |
| 7,231,558 B2 | 6/2007 | Gentieu et al. |
| 7,269,130 B2 | 9/2007 | Pitio |
| 7,269,212 B1 | 9/2007 | Chau et al. |
| 7,335,976 B2 | 2/2008 | Chen et al. |
| 7,346,819 B2 | 3/2008 | Bansal et al. |
| 7,356,213 B1 | 4/2008 | Cunningham et al. |
| 7,358,869 B1 | 4/2008 | Chiarulli et al. |
| 7,362,130 B2 | 4/2008 | Broyde et al. |
| 7,362,697 B2 | 4/2008 | Becker et al. |
| 7,370,264 B2 | 5/2008 | Worley et al. |
| 7,496,130 B2 | 2/2009 | Rumney |
| 7,633,850 B2 | 12/2009 | Ahn |
| 7,643,588 B2 | 1/2010 | Visalli et al. |
| 7,656,321 B2 | 2/2010 | Wang |
| 7,694,204 B2 | 4/2010 | Schmidt et al. |
| 7,698,088 B2 | 4/2010 | Sul et al. |
| 7,706,456 B2 | 4/2010 | Laroia et al. |
| 7,734,191 B1 | 6/2010 | Welch et al. |
| 7,746,764 B2 | 6/2010 | Rawlins et al. |
| 7,868,790 B2 | 1/2011 | Bae |
| 7,869,546 B2 | 1/2011 | Tsai |
| 7,882,413 B2 | 2/2011 | Chen et al. |
| 7,899,653 B2 | 3/2011 | Hollis |
| 7,933,770 B2 | 4/2011 | Krueger et al. |
| 8,050,332 B2 | 11/2011 | Chung et al. |
| 8,055,095 B2 | 11/2011 | Palotai et al. |
| 8,091,006 B2 | 1/2012 | Prasad et al. |
| 8,149,906 B2 | 4/2012 | Saito et al. |
| 8,159,375 B2 | 4/2012 | Abbasfar |
| 8,159,376 B2 | 4/2012 | Abbasfar |
| 8,185,807 B2 | 5/2012 | Oh et al. |
| 8,199,849 B2 | 6/2012 | Oh et al. |
| 8,199,863 B2 | 6/2012 | Chen et al. |
| 8,209,580 B1 | 6/2012 | Varnica et al. |
| 8,218,670 B2 | 7/2012 | Abou |
| 8,233,544 B2 | 7/2012 | Bao et al. |
| 8,238,318 B1 | 8/2012 | Negus |
| 8,245,094 B2 | 8/2012 | Jiang et al. |
| 8,245,102 B1 | 8/2012 | Cory et al. |
| 8,279,094 B2 | 10/2012 | Abbasfar |
| 8,279,745 B2 | 10/2012 | Dent |
| 8,279,976 B2 | 10/2012 | Lin et al. |
| 8,284,848 B2 | 10/2012 | Nam et al. |
| 8,289,914 B2 | 10/2012 | Li et al. |
| 8,295,250 B2 | 10/2012 | Gorokhov et al. |
| 8,338,318 B2 | 12/2012 | Siebers et al. |
| 8,341,492 B2 | 12/2012 | Shen et al. |
| 8,365,035 B2 | 1/2013 | Hara |
| 8,429,492 B2 | 4/2013 | Yoon et al. |
| 8,429,495 B2 | 4/2013 | Przybylski |
| 8,462,891 B2 | 6/2013 | Kizer et al. |
| 8,472,513 B2 | 6/2013 | Malipatil et al. |
| 8,498,368 B1 | 7/2013 | Husted et al. |
| 8,520,493 B2 | 8/2013 | Goulahsen |
| 8,521,020 B2 | 8/2013 | Welch et al. |
| 8,539,318 B2 | 9/2013 | Shokrollahi et al. |
| 8,577,284 B2 | 11/2013 | Seo et al. |
| 8,578,246 B2 | 11/2013 | Mittelholzer et al. |
| 8,588,254 B2 | 11/2013 | Diab et al. |
| 8,588,280 B2 | 11/2013 | Oh et al. |

(56) References Cited

U.S. PATENT DOCUMENTS

| | | |
|---|---|---|
| 8,593,305 B1 | 11/2013 | Tajalli et al. |
| 8,620,166 B2 | 12/2013 | Guha |
| 8,644,497 B2 | 2/2014 | Clausen et al. |
| 8,649,445 B2 | 2/2014 | Cronie et al. |
| 8,687,968 B2 | 4/2014 | Nosaka et al. |
| 8,711,919 B2 | 4/2014 | Kumar |
| 8,718,184 B1 | 5/2014 | Cronie et al. |
| 8,731,039 B1 | 5/2014 | Sarrigeorgidis et al. |
| 8,755,426 B1 | 6/2014 | Cronie et al. |
| 8,773,964 B2 | 7/2014 | Hsueh et al. |
| 8,780,687 B2 | 7/2014 | Clausen et al. |
| 8,792,594 B2 | 7/2014 | Vojcic et al. |
| 8,831,440 B2 | 9/2014 | Yu et al. |
| 8,879,660 B1 | 11/2014 | Peng et al. |
| 8,938,171 B2 | 1/2015 | Tang et al. |
| 8,949,693 B2 | 2/2015 | Ordentlich et al. |
| 8,989,317 B1 | 3/2015 | Holden et al. |
| 8,996,740 B2 | 3/2015 | Wiley et al. |
| 9,015,566 B2 | 4/2015 | Cronie et al. |
| 9,071,476 B2 | 6/2015 | Fox et al. |
| 9,077,386 B1 | 7/2015 | Holden et al. |
| 9,100,232 B1 | 8/2015 | Hormati et al. |
| 9,152,495 B2 | 10/2015 | Losh et al. |
| 9,172,412 B2 | 10/2015 | Kim et al. |
| 9,183,085 B1 | 11/2015 | Northcott |
| 9,197,470 B2 | 11/2015 | Okunev |
| 9,246,713 B2 | 1/2016 | Shokrollahi |
| 9,251,873 B1 | 2/2016 | Fox et al. |
| 9,288,082 B1 | 3/2016 | Ulrich et al. |
| 9,288,089 B2 | 3/2016 | Cronie et al. |
| 9,331,962 B2 | 5/2016 | Lida et al. |
| 9,362,974 B2 | 6/2016 | Fox et al. |
| 9,363,114 B2 | 6/2016 | Shokrollahi et al. |
| 9,401,828 B2 | 7/2016 | Cronie et al. |
| 9,432,082 B2 | 8/2016 | Ulrich et al. |
| 9,444,654 B2 | 9/2016 | Hormati et al. |
| 9,455,744 B2 | 9/2016 | George et al. |
| 9,461,862 B2 | 10/2016 | Holden et al. |
| 9,479,369 B1 | 10/2016 | Shokrollahi |
| 9,509,437 B2 | 11/2016 | Shokrollahi |
| 9,537,644 B2 | 1/2017 | Jones et al. |
| 9,608,669 B2 | 3/2017 | Song et al. |
| 9,634,797 B2 | 4/2017 | Benammar et al. |
| 9,667,379 B2 | 5/2017 | Cronie et al. |
| 9,710,412 B2 | 7/2017 | Sengoku |
| 9,852,806 B2 | 12/2017 | Stauffer et al. |
| 10,055,372 B2 | 8/2018 | Shokrollahi |
| 10,396,819 B1 * | 8/2019 | Myung ............ H03M 13/2792 |
| 10,873,373 B2 * | 12/2020 | Suh ..................... H04B 7/0452 |
| 2001/0000219 A1 | 4/2001 | Agazzi et al. |
| 2001/0006538 A1 | 7/2001 | Simon et al. |
| 2001/0055294 A1 | 12/2001 | Motoyoshi |
| 2002/0044316 A1 | 4/2002 | Myers |
| 2002/0152340 A1 | 10/2002 | Dreps et al. |
| 2002/0154633 A1 | 10/2002 | Shin et al. |
| 2002/0163881 A1 | 11/2002 | Dhong et al. |
| 2002/0174373 A1 | 11/2002 | Chang |
| 2002/0181607 A1 | 12/2002 | Izumi |
| 2003/0016770 A1 | 1/2003 | Trans et al. |
| 2003/0086366 A1 | 5/2003 | Branlund et al. |
| 2003/0087634 A1 | 5/2003 | Raghavan et al. |
| 2003/0185310 A1 | 10/2003 | Ketchum et al. |
| 2004/0057525 A1 | 3/2004 | Rajan et al. |
| 2004/0146117 A1 | 7/2004 | Subramaniam et al. |
| 2004/0155802 A1 | 8/2004 | Lamy et al. |
| 2004/0161019 A1 | 8/2004 | Raghavan et al. |
| 2004/0239374 A1 | 12/2004 | Hori |
| 2005/0213686 A1 | 9/2005 | Love et al. |
| 2006/0013331 A1 | 1/2006 | Choi et al. |
| 2006/0080087 A1 | 4/2006 | Vandali et al. |
| 2006/0126751 A1 | 6/2006 | Bessios |
| 2006/0159005 A1 | 7/2006 | Rawlins et al. |
| 2006/0245757 A1 | 11/2006 | Elahmadi et al. |
| 2006/0251421 A1 | 11/2006 | Arnon |
| 2006/0291571 A1 | 12/2006 | Divsalar et al. |
| 2006/0291589 A1 | 12/2006 | Eliezer et al. |
| 2007/0030796 A1 | 2/2007 | Green |
| 2007/0070967 A1 | 3/2007 | Yang et al. |
| 2007/0076871 A1 | 4/2007 | Renes |
| 2007/0204205 A1 | 8/2007 | Niu et al. |
| 2007/0283210 A1 | 12/2007 | Prasad et al. |
| 2008/0016432 A1 | 1/2008 | Lablans |
| 2008/0043677 A1 | 2/2008 | Kim et al. |
| 2008/0104374 A1 | 5/2008 | Mohamed |
| 2008/0192621 A1 | 8/2008 | Suehiro |
| 2008/0316070 A1 | 12/2008 | Van et al. |
| 2009/0046009 A1 | 2/2009 | Fujii |
| 2009/0059782 A1 | 3/2009 | Cole |
| 2009/0110106 A1 | 4/2009 | Wornell et al. |
| 2009/0141827 A1 | 6/2009 | Saito et al. |
| 2009/0150754 A1 | 6/2009 | Dohmen et al. |
| 2009/0154604 A1 | 6/2009 | Lee et al. |
| 2009/0316730 A1 | 12/2009 | Feng et al. |
| 2010/0046644 A1 | 2/2010 | Mazet |
| 2010/0054355 A1 | 3/2010 | Kinjo et al. |
| 2010/0081451 A1 | 4/2010 | Mueck et al. |
| 2010/0146363 A1 * | 6/2010 | Birru ..................... H04L 1/0071 714/752 |
| 2010/0215112 A1 | 8/2010 | Tsai et al. |
| 2010/0235673 A1 | 9/2010 | Abbasfar |
| 2010/0287438 A1 | 11/2010 | Lakkis |
| 2010/0296556 A1 | 11/2010 | Rave et al. |
| 2010/0309964 A1 | 12/2010 | Oh et al. |
| 2011/0014865 A1 | 1/2011 | Seo et al. |
| 2011/0018749 A1 | 1/2011 | Muto et al. |
| 2011/0051854 A1 | 3/2011 | Kizer et al. |
| 2011/0072330 A1 | 3/2011 | Kolze |
| 2011/0122767 A1 | 5/2011 | Dent |
| 2011/0134678 A1 | 6/2011 | Sato et al. |
| 2011/0235501 A1 | 9/2011 | Goulahsen |
| 2011/0268225 A1 | 11/2011 | Cronie et al. |
| 2011/0286497 A1 | 11/2011 | Nervig |
| 2011/0299555 A1 | 12/2011 | Cronie et al. |
| 2011/0302478 A1 | 12/2011 | Cronie et al. |
| 2012/0036415 A1 | 2/2012 | Shafrir et al. |
| 2012/0213299 A1 | 8/2012 | Cronie et al. |
| 2012/0257683 A1 | 10/2012 | Schwager et al. |
| 2012/0272117 A1 * | 10/2012 | Stadelmeier ............ H04L 1/008 714/752 |
| 2013/0010892 A1 | 1/2013 | Cronie et al. |
| 2013/0013870 A1 | 1/2013 | Cronie et al. |
| 2013/0114392 A1 | 5/2013 | Sun et al. |
| 2013/0202001 A1 * | 8/2013 | Zhang .................... H04L 5/0007 370/476 |
| 2013/0259113 A1 | 10/2013 | Kumar |
| 2013/0315264 A1 * | 11/2013 | Srinivasa ................. H04L 5/00 370/474 |
| 2013/0315501 A1 | 11/2013 | Atanassov et al. |
| 2013/0346830 A1 | 12/2013 | Ordentlich et al. |
| 2014/0068385 A1 * | 3/2014 | Zhang .................... H04L 1/005 714/776 |
| 2014/0068391 A1 | 3/2014 | Goel et al. |
| 2014/0079394 A1 * | 3/2014 | Xie ...................... H04B 10/532 398/65 |
| 2014/0112376 A1 | 4/2014 | Wang et al. |
| 2014/0177645 A1 | 6/2014 | Cronie et al. |
| 2014/0254642 A1 | 9/2014 | Fox et al. |
| 2015/0070201 A1 | 3/2015 | Dedic et al. |
| 2015/0078479 A1 | 3/2015 | Whitby-Strevens |
| 2015/0092532 A1 | 4/2015 | Shokrollahi et al. |
| 2015/0222458 A1 | 8/2015 | Hormati et al. |
| 2015/0236885 A1 | 8/2015 | Ling et al. |
| 2015/0249559 A1 | 9/2015 | Shokrollahi et al. |
| 2015/0333940 A1 | 11/2015 | Shokrollahi |
| 2015/0349835 A1 | 12/2015 | Fox et al. |
| 2015/0365263 A1 | 12/2015 | Zhang et al. |
| 2015/0380087 A1 | 12/2015 | Mittelholzer et al. |
| 2015/0381315 A1 * | 12/2015 | Thomson ............... H04L 1/0045 714/776 |
| 2015/0381768 A1 | 12/2015 | Fox et al. |
| 2016/0020796 A1 | 1/2016 | Hormati et al. |
| 2016/0020824 A1 | 1/2016 | Ulrich et al. |
| 2016/0036616 A1 | 2/2016 | Holden et al. |
| 2016/0218894 A1 | 7/2016 | Fox et al. |

(56) References Cited

U.S. PATENT DOCUMENTS

| | | | |
|---|---|---|---|
| 2016/0338040 A1 | 11/2016 | Lee et al. | |
| 2016/0380787 A1 | 12/2016 | Hormati et al. | |
| 2017/0272285 A1 | 9/2017 | Shokrollahi et al. | |
| 2019/0103903 A1 | 4/2019 | Yang | |
| 2020/0321778 A1 | 10/2020 | Gharibdoust et al. | |

FOREIGN PATENT DOCUMENTS

| | | |
|---|---|---|
| CN | 101854223 A | 10/2010 |
| CN | 101820288 B | 1/2013 |
| EP | 1926267 A1 | 5/2008 |
| JP | 2003163612 A | 6/2003 |
| JP | 4394755 B2 | 10/2009 |
| WO | 2005002162 A1 | 1/2005 |
| WO | 2005032000 A1 | 4/2005 |
| WO | 2009084121 A1 | 7/2009 |
| WO | 2010031824 A1 | 3/2010 |
| WO | 2019241081 A1 | 12/2019 |

OTHER PUBLICATIONS

Abbasfar, Aliazam , "Generalized Differential Vector Signaling", IEEE International Conference on Communications, ICC '09, Jun. 14, 2009, 1-5 (5 pages).

Anonymous , "Constant-weight code", Wikipedia.org, retrieved on Feb. 6, 2017, (3 pages).

Ben-Neticha, Zouhair , et al., "The "Stretched"—Golay and Other Codes for High-SNR Finite-Delay Quantization of the Gaussian Source at 1/2 Bit Per Sample", IEEE Transactions on Communications, New York, US, vol. 38, No. 12, XP000203339, Dec. 1990, 2089-2093 (5 pages).

Burr, A.G., "Spherical Codes for M-ARY Code Shift Keying", Second IEE National Conference on Telecommunications, University of York, UK, Apr. 2, 1989, 67-72 (6 pages).

Counts, Lew , et al., "One-Chip "Slide Rule" Works with Logs, Antilogs for Real-Time Processing", Analog Devices, Computational Products 6, Reprinted from Electronic Design, May 2, 1985, 3-9 (7 pages).

Dasilva, Victor , et al., "Multicarrier Orthogonal CDMA Signals for Quasi-Synchronous Communication Systems", IEEE Journal on Selected Areas in Communications, vol. 12, No. 5, Jun. 1994, 842-852 (11 pages).

Ericson, Thomas , et al., "Spherical Codes Generated by Binary Partitions of Symmetric Pointsets", IEEE Transactions on Information Theory, vol. 41, No. 1, Jan. 1995, 107-129 (23 pages).

Farzan, Kamran , et al., "Coding Schemes for Chip-to-Chip Interconnect Applications", IEEE Transactions on Very Large Scale Integration (VLSI) Systems, vol. 14, No. 4, Apr. 2006, 393-406 (14 pages).

Giovaneli, Carlos Lopez, et al., "Space-Frequency Coded OFDM System for Multi-Wire Power Line Communications", Power Line Communications and Its Applications, 2005 International Symposium on Vancouver, BC, Canada, IEEE XP-002433844, Apr. 6-8, 2005, 191-195 (5 pages).

Healey, Adam , et al., "A Comparison of 25 Gbps NRZ & PAM-4 Modulation used in Legacy & Premium Backplane Channels", Tyco Electronics Corporation, DesignCon 2012, Jan. 2012, 1-16 (16 pages).

Holden, Brian , "An exploration of the technical feasibility of the major technology options for 400GE backplanes", IEEE 802.3 400GE Study Group, Geneva, CH, Jul. 16, 2013, 1-18 (18 pages).

Holden, Brian , "Simulation results for NRZ, ENRZ & PAM-4 on 16-wire full-sized 400GE backplanes", IEEE 802.3 400GE Study Group, York, UK, Sep. 2, 2013, 1-19 (19 pages).

Holden, Brian , "Using Ensemble NRZ Coding for 400GE Electrical Interfaces", IEEE 802.3 400GE Study Group, May 17, 2013, 1-24 (24 pages).

Jiang, Anxiao , et al., "Rank Modulation for Flash Memories", IEEE Transactions of Information Theory, vol. 55, No. 6, Jun. 2009, 2659-2673 (16 pages).

Oh, Dan , et al., "Pseudo-Differential Vector Signaling for Noise Reduction in Single-Ended Signaling Systems", DesignCon 2009, Rambus Inc., Jan. 2009, (22 pages).

Poulton, John , "Multiwire Differential Signaling", UNC-CH Department of Computer Science Version 1.1, Aug. 6, 2003, 1-20 (20 pages).

She, James , et al., "A Framework of Cross-Layer Superposition Coded Multicast for Robust IPTV Services over WiMAX", IEEE Wireless Communications and Networking Conference, Apr. 15, 2008, 3139-3144 (6 pages).

Skliar, Osvaldo , et al., "A Method For the Analysis of Signals: the Square-Wave Method", Revista de Matematica: Teoria y Aplicationes, vol. 15, No. 2, Mar. 2008, 109-129 (21 pages).

Slepian, David , "Permutation Modulation", Proceedings of the IEE, vol. 53, No. 3, Mar. 1965, 228-236 (9 pages).

Wang, Xin , et al., "Applying CDMA Technique to Network-on-Chip", IEEE Transactions on Very Large Scale Integration (VLSI) Systems, vol. 15, No. 10, Oct. 1, 2007, 1091-1100 (10 pages).

\* cited by examiner

MULTI-WIRE PERMUTED FORWARD ERROR CORRECTION

CROSS-REFERENCE TO RELATED APPLICATIONS

This application is a continuation of U.S. application Ser. No. 16/031,877, filed Jul. 10, 2018, issued as U.S. Pat. No. 10,693,587 on Jun. 23, 2020, naming Amin Shokrollahi, entitled "Multi-Wire Permuted Forward Error Correction", which claims the benefit of U.S. Provisional Application No. 62/530,809, filed Jul. 10, 2017, naming Amin Shokrollahi and Ali Hormati, entitled "Multi-Wire Permuted Forward Error Correction", all of which are hereby incorporated herein by reference in their entirety for all purposes.

REFERENCES

The following prior applications are herein incorporated by reference in their entirety for all purposes:

U.S. Pat. No. 9,288,089 of application Ser. No. 12/784,414, filed May 20, 2010, naming Harm Cronie and Amin Shokrollahi, entitled "Orthogonal Differential Vector Signaling" (hereinafter "Cronie I").

U.S. patent application Ser. No. 13/154,009, filed Jun. 5, 2011, naming Harm Cronie and Amin Shokrollahi, entitled "Error Control Coding for Orthogonal Differential Vector Signaling" (hereinafter "Cronie II").

U.S. patent application Ser. No. 14/253,584, filed Apr. 15, 2014, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Communications Interface" (hereinafter called "Fox I")

U.S. Pat. No. 8,296,632 of application Ser. No. 12/479,605, filed Jun. 5, 2009, naming Amin Shokrollahi, entitled "Encoding and decoding of generalized Reed-Solomon codes using parallel processing techniques" (hereinafter "Shokrollahi I").

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. Provisional Patent Application No. 62/485,677, filed Apr. 14, 2017, naming Amin Shokrollahi and Dario Carnelli, entitled "Pipelined Forward Error Correction for Vector Signaling Code Channel", hereinafter identified as [Shokrollahi III].

FIELD OF THE INVENTION

The present embodiments relate to communications systems circuits generally, and more particularly to reduction of communication errors over a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

BRIEF DESCRIPTION

In conventional bit-serial communications systems, data words provided by a transmitting or source process are serialized into a sequential stream of bits, in one exemplary embodiment using a digital shift register. At the receiver, sequentially detected bits are deserialized using comparable means, so that a receiving or destination process may be presented with complete data words equivalent to those provided at the transmitter. Vector signaling code communication systems perform comparable operations, although in these embodiments the serialization process generally breaks words into symbol groups (e.g. into five bit elements for a CNRZ-5 system,) and the equivalent deserialization process assembles received groups (of five bits, continuing the same example,) into words again.

Forward Error Correction (FEC) methods have been developed which introduce redundancy into such transmitted data streams as part of a check code that both detects and facilitates correction of errors. The order in which data and redundancy information are structured into a transmitted data stream can significantly impact overall communication latency, especially if multiple essentially parallel communications channels are involved. Solutions are described utilizing interleaving to optimize both burst error control and latency.

Embodiments are described for permuting the transmission order of FEC encoded packets from multiple encoding streams such that sequential packets from each stream are not transmitted sequentially on the same sub-channel nor simultaneously on another sub-channel of a multi sub-channel vector signaling code sent over a multi-wire bus.

Methods and systems are described for obtaining a plurality of information bits, and responsively partitioning the obtained plurality of information bits into a plurality of subsets of information bits, generating a plurality of streams of forward error correction (FEC)-encoded bits using a plurality of FEC encoders receiving respective subsets of the plurality of subsets of information bits, providing the plurality of streams of FEC-encoded bits to a plurality of sub-channel encoders, each sub-channel encoder receiving a respective stream of FEC-encoded bits from a different FEC encoder of the plurality of FEC encoders for generating a set of codewords of a vector signaling code, and wherein sequential streams of FEC-encoded bits from a given FEC encoder are provided to different sub-channel encoders for each successively generated set of codewords, and transmitting the successively generated sets of codewords of the vector signaling code over a multi-wire bus.

DETAILED DESCRIPTION

Figure 1:
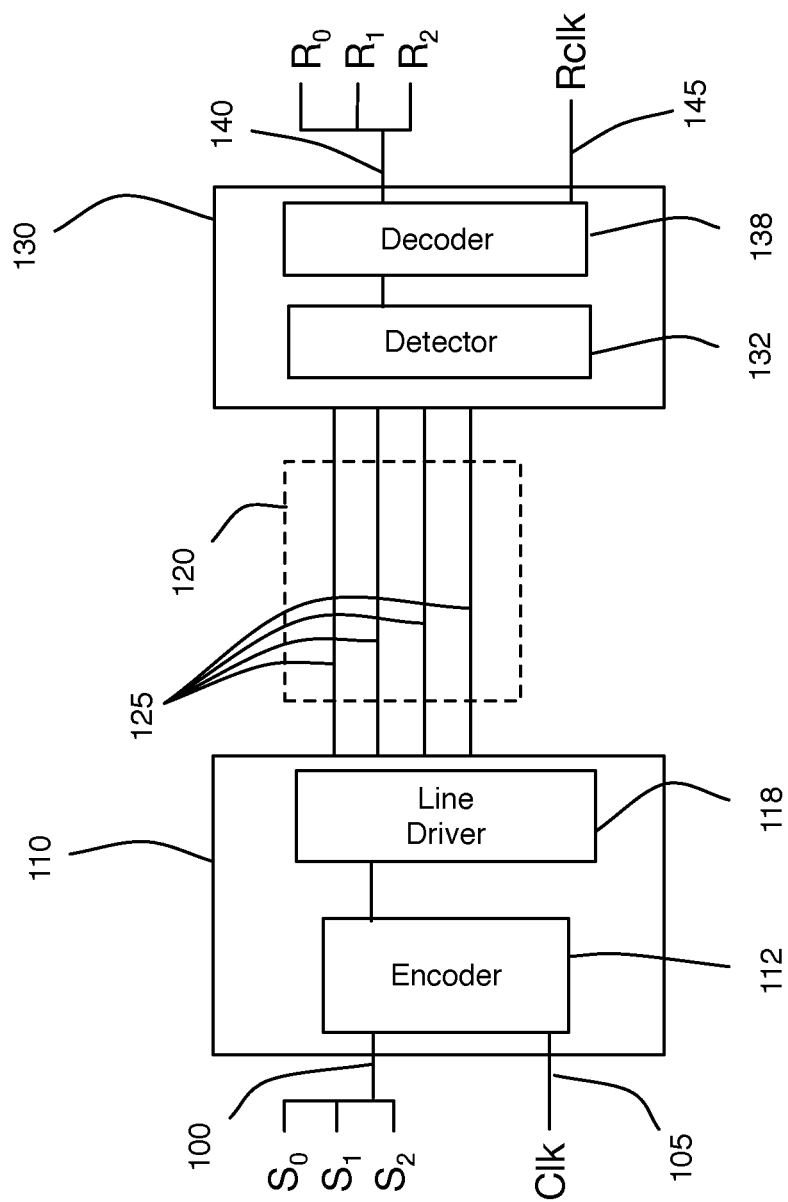
FIG. 1 is a block diagram of a system that may serve as the physical transport for the described embodiments, with transmitter 110 communicating over a multiwire 125 communications channel 120 to receiver 130.

As described in [Cronie I], [Cronie II], and [Shokrollahi II], vector signaling codes may be used to produce extremely high bandwidth data communications links, such as between two integrated circuit devices in a system. As illustrated by the embodiment of FIG. 1, a data communications channel 120 comprised of multiple wires 125 carries symbols of the vector signaling code, acting together to communicate codewords of the vector signaling code. Depending on the particular vector signaling code used, the number of wires making up a communications link or multi-wire bus may range from two to eight or more, and may also communicate one or more clock signals on separate wires or as sub-channel components of the vector signaling code. In the example of FIG. 1, communication link 120 is illustrated as being composed of eight wires 125, collectively communicating five data values 100 and one clock 105 between transmitter 110 and receiver 130. Further descriptions of such communications links are provided in [Shokrollahi II].

Individual symbols, e.g. transmissions on any single wire, may utilize multiple signal levels, often three or more. Operation at channel rates exceeding 10 Gbps may further complicate receive behavior by requiring deeply pipelined or parallelized signal processing. Embodiments described herein can also be applied to prior art permutation sorting methods not covered by the vector processing methods of [Shokrollahi II]. More generally, embodiments may apply to any communication or storage methods utilizing coordination of multiple channels or elements of the channel to produce a coherent aggregate result.

Because of its characteristic of transmitting multiple symbols essentially in parallel, vector signaling codes are generally considered as communicating data in symbol groups, for example in five-bit increments for the CNRZ-5 code of [Shokrollahi II], or in three-bit increments for the H4 code of [Shokrollahi I], also described in [Fox I] as the Enhanced Non-Return to Zero or ENRZ code. High-bandwidth systems may utilize multiple vector signaling code channels, distributing data across the multiple channels for transmission, and gathering received data from the multiple channels to be transparently combined again at the receiver. Thus, this document may subsequently describe transport as occurring in increments of K*n bits, where n is that code's symbol group or payload size. That reference additionally notes, however, that the encoded sub-channels transporting individual bits are mathematically distinct, and in certain embodiments may be treated as independent transport channels.

Serialization and Deserialization

In conventional bit-serial communications systems, data words provided by a transmitting or source process are serialized into a sequential stream of bits, in one exemplary embodiment using a digital shift register. At the receiver, sequentially detected bits are deserialized using comparable means, so that a receiving or destination process may be presented with complete data words equivalent to those provided at the transmitter. Vector signaling code communication systems perform comparable operations, although in these embodiments the serialization process generally breaks words into symbol groups (e.g. into five bit elements for a CNRZ-5 system,) and the equivalent deserialization process assembles received groups (of five bits, continuing the same example,) into words again.

As is readily apparent, serialization and deserialization introduce latency into the communication channel, with the amount of latency dependent on the number of transmitted elements into which a given data word is serialized, as the entire word is not available until its last-transmitted element has been received and the received word fully reassembled.

In some high-speed communications systems, serialization and deserialization may additionally incorporate multiple processing phases operating essentially in parallel, to provide additional processing time within each phase and/or to permit processing operation using a lower clock rate to reduce power consumption. In one representative embodiment, data words presented by the transmission or source process are broken into symbol groups, with consecutive symbol groups being assigned to sequentially chosen processing phases which perform the necessary encoding, formatting, etc. As each processing phase completes its operations, the processed results are transferred to an output driver for transmission over the communications medium. Thus, in the case where four processing phases are used, each phase will have approximately four transmit unit intervals of time to perform the necessary operations. Similar multiphase processing may occur at the receiver; consecutively received symbol groups being detected by sequentially assigned processing phases and reassembled into output words.

Embodiments incorporating multiple processing phases are used herein as descriptive examples, so as to provide the broadest and most complete illustration of features and behaviors. Other embodiments may utilize fewer or more processing phases, including a single instance, and may incorporate greater or lesser amount of transmit and/or receive processing into the essentially parallel processing phases, with no limitation implied by these examples.

Link Error Correction

Communications system designs emphasize error-free transport of data, despite the inevitable presence of noise and other signal disruptions. Error probabilities over the communications path are expressed as a Bit Error Rate (BER), representing the ratio of bit errors received to overall bits transmitted.

Solutions to detect bit errors, including cyclic check codes, parity, and redundant transmission, are known in the art. Similarly, solutions are known for correction of errors, most notably the closed-loop retransmission methods of the TCP/IP protocol suite, in which a receiver detects an error, uses a return channel to request a retransmission by the transmitter, and then transparently inserts the corrected data into its output stream.

Forward Error Correction

Where use of a return channel is impossible or the round-trip latency of waiting for a retransmission is unacceptable, Forward Error Correction (FEC) methods have been developed which introduce redundancy into the transmitted data stream as part of a check code that both detects and facilitates correction of errors. The more redundancy introduced into the transmitted data stream (e.g. by use of a longer FEC sequence,) the greater the ability of the FEC to correct bit errors, but also the greater the protocol overhead, presenting itself as a lower effective data transmission rate.

In cases where the native communications link has relatively low uncorrected BER (e.g., $1\times10^{-9}$ to $1\times10^{-10}$) and the target BER is of the order of $1\times10^{-15}$ to $1\times10^{-20}$, other solutions can be found with much lower latency. This is the case, as one example, for the low latency FEC of [Shokrollahi III], targeted for in-package die-to-die links that use vector signaling code such as the Glasswing or CNRZ-5 code of [Shokrollahi II].

Example Embodiment

For purposes of explanation and without implying limitation, the reference system for the following descriptions is assumed to have the following characteristics:
 Underlying transport providing three sub-channels using ENRZ coding at a 25 Gigasymbol/second rate, equivalent to a 40 picosecond unit interval.
 Uncorrected BER in the range of 10E-8 to 10E-9, comprised of both random bit and short burst errors
 Corrected FER or BER less than 10E-19
 FEC latency of 80 ns or less.

FIG. 1 is a block diagram of a system that may serve as the physical transport for such a system, with transmitter 110 communicating over a multiwire 125 communications channel 120 to receiver 130.

Figure 2:
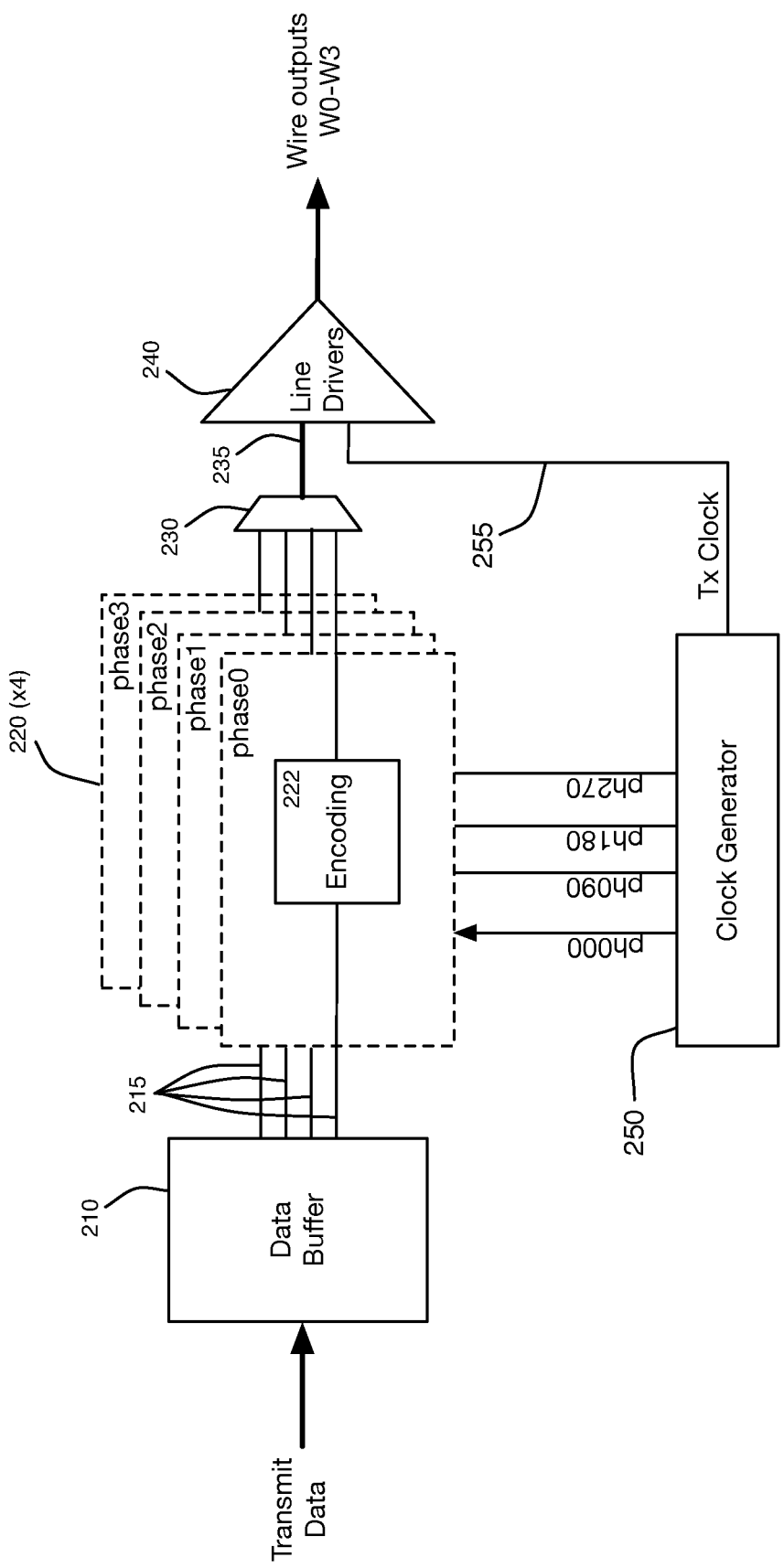
FIG. 2 is a more detailed block diagram of Transmitter 110 of FIG. 1.

FIG. 2 illustrates a more detailed block diagram of transmitter 110. In a practical embodiment operating at the example speeds, data will typically be provided using a fairly wide-word interface, to allow a slower transfer rate, with Data Buffer 210 providing the necessary temporary storage and data funneling to the ENRZ sub-channels, which typically transports one bit per unit interval per sub-channel. Multiple data processing phases 220 may be utilized, as are typically used in such high-speed systems. Data Buffer 210 thus reformats Transmit Data into appropriate width for each of the processing phases, but may also distribute data among multiple processing phases to enable parallel computation. Data is encoded 220 and output to Wire outputs W0-W3 by Line Drivers 240 under control of Clock Generator 250. If multiple parallel processing phases are used, multiplexers 230 combine the multiple encoded streams into a single high speed result 235.

Figure 3:
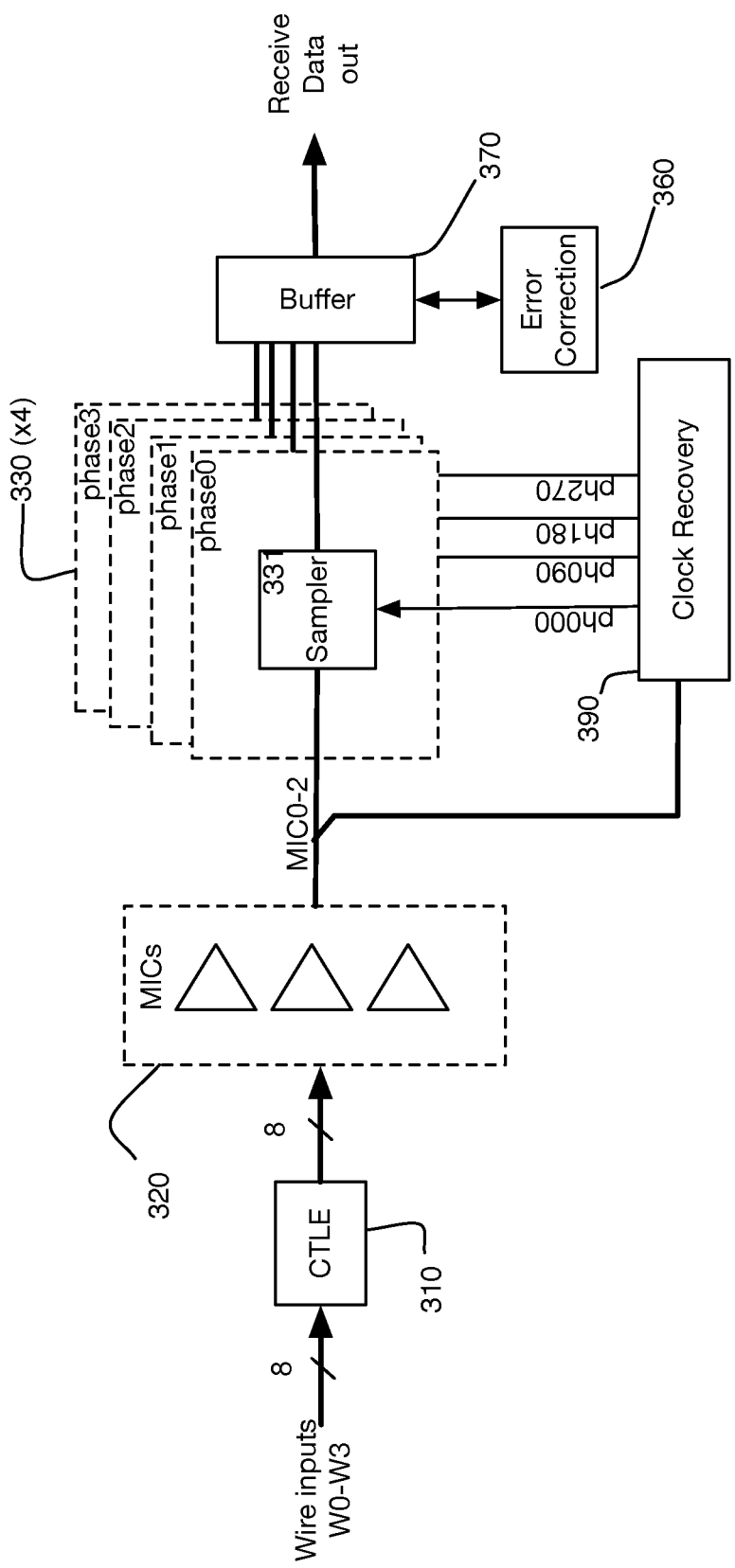
FIG. 3 is a more detailed block diagram of Receiver 130 of FIG. 1.

FIG. 3 provides a more detailed block diagram of receiver 130. Signals received over Wire inputs W0-W3 are amplified and frequency compensated by Continuous Time Linear Equalizers (CTLE) 310. ENRZ sub-channels are decoded by Multi-input Comparators (MICs) 320, producing three sub-channel results MIC0-MIC2. Clock Recovery subsystem 390 synthesizes a receive clock from data transitions on received sub-channels MIC0-MIC2. As with the example transmitter, multiple receive processing phases 330 will typically be used to facilitate high speed operation, each such phase sampling the received data using the recovered clock. Buffer 370 allows high speed data received from 330 to be reformatted from the typical one received bit per sub-channel per unit interval, into the wider words and slower transfer rates needed to interface to an external system. In some embodiments such as described in [Shokrollahi III], this buffer also provides temporary storage while Error Correction 360 corrects any detected data errors.

Figure 4:
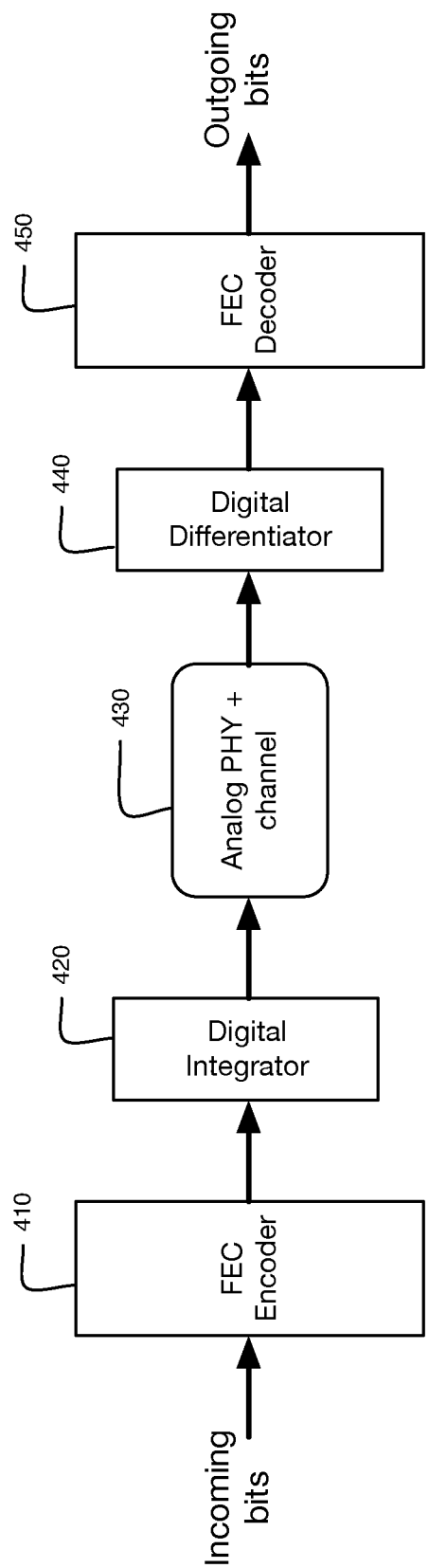
FIG. 4 is a block diagram of an embodiment of an error corrected system, where lower-level transport and PHY 430 may be the systems of FIGS. 1-3.

FIG. 4 is a high-level block diagram of the error corrected system, showing the ENRZ transport 430 of FIGS. 1-3 as its lower-level or PHY medium. For descriptive purposes, data is described as passing through this system as streams of bytes, although other embodiments may operate at a different granularity; as previously described, the underlying ENRZ transport typically transmits or receives one bit per sub-channel per unit interval, thus an intrinsic serialization/deserialization is assumed to be part of the PHY embodiment.

Figure 5A:
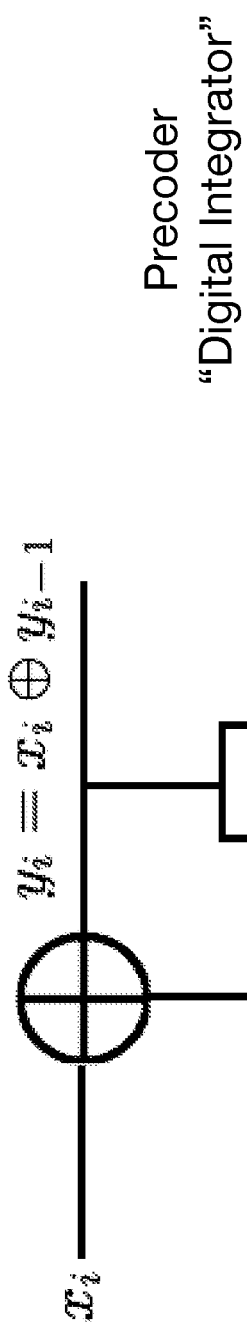
FIG. 5A illustrates operation of Digital Integrator 420 of FIG. 4.
Figure 5B:
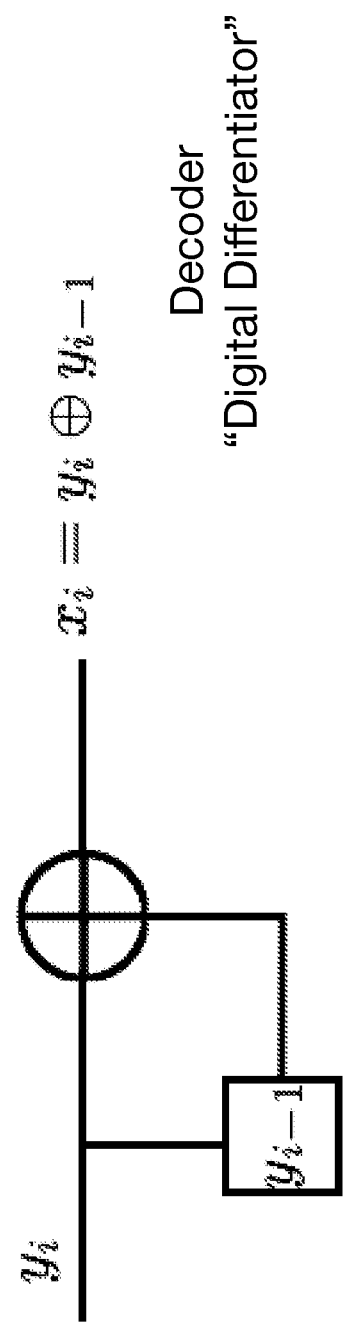
FIG. 5B illustrates operation of the Digital Differentiator function 440 of FIG. 4.

As used herein, the definition of Digital Integrator 420 is as shown as FIG. 5A, and the definition of Digital Differentiator 440 is as shown as FIG. 5B. These functions are used to control the impact of burst errors, with each burst becoming two bit errors after digital differentiation. The descriptive examples presume these functions perform bit-wise operations on a data stream, although known art embodiments operating, as one example on streams of bytes are well known thus no limitation is implied.

Without implying limitation, the Forward Error Correcting algorithm assumed in the following descriptions is a Generalized Reed-Solomon code over the Galois Field GF(256), of length 255, capable of 5-error correcting with a 3.92% redundancy. Another embodiment providing 4-error correcting with 3.14% redundancy is functionally equivalent. Both examples are compatible with the interleaving patterns subsequently described.

Addressing Channel Error Characteristics

Modeling the underlying transport system for error sources, two distinct error modes become apparent. A generalized fault condition or noise source can impact the entire ENRZ transport, introducing codeword errors that lead to essentially simultaneous errors on all sub-channels. Or, more subtly, noise, attenuation, or skew on a subset of the wires may lead to one sub-channel having a substantially higher error rate than the others.

Figure 6:
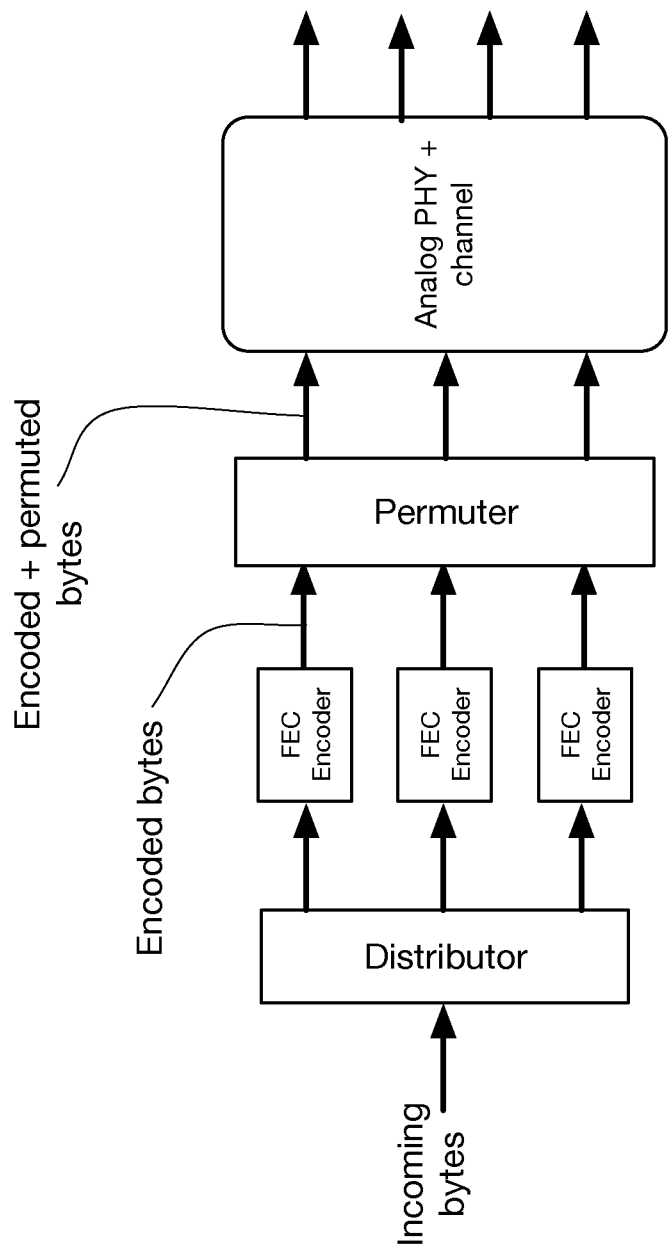
FIG. 6 is a block diagram showing the Distribution of incoming data bytes to multiple FEC Encoders, with the resulting output streams being acted upon by a permuter function prior to transport.

These risks may be mitigated by running separate instances of the FEC algorithm on each of the three ENRZ sub-channels, thus allowing error correction to occur independently. As described in [Fox I], the three sub-channels of the ENRZ code may correspond to mutually orthogonal sub-channel vectors corresponding to rows of an orthogonal matrix. Each row of the orthogonal matrix may be weighted by a respective input bit from e.g., one of the FEC-encoded streams, and all weighted sub-channel vectors may be summed to provide a codeword of the ENRZ vector signaling code. As shown in FIG. 6, a Distributor function distributes or "deals out" incoming data to the individual FEC encoders for transport over the three sub-channels of the ENRZ PHY. In one embodiment, this Distribution is performed on data bytes; other embodiments may perform this distribution at a different granularity. In some embodiments, distributing the streams of FEC-encoded bits as bytes may generate successive sets of codewords, where each successive set of codewords is generated by providing sequential streams of FEC-encoded bits from a given FEC encoder to different sub-channel encoders. Alternatively, if the streams of FEC-encoded bits are distributed of bits, each successive codeword may be generated by providing sequential FEC-encoded bits from a given FEC encoder to different sub-channel encoders.

Figure 7:
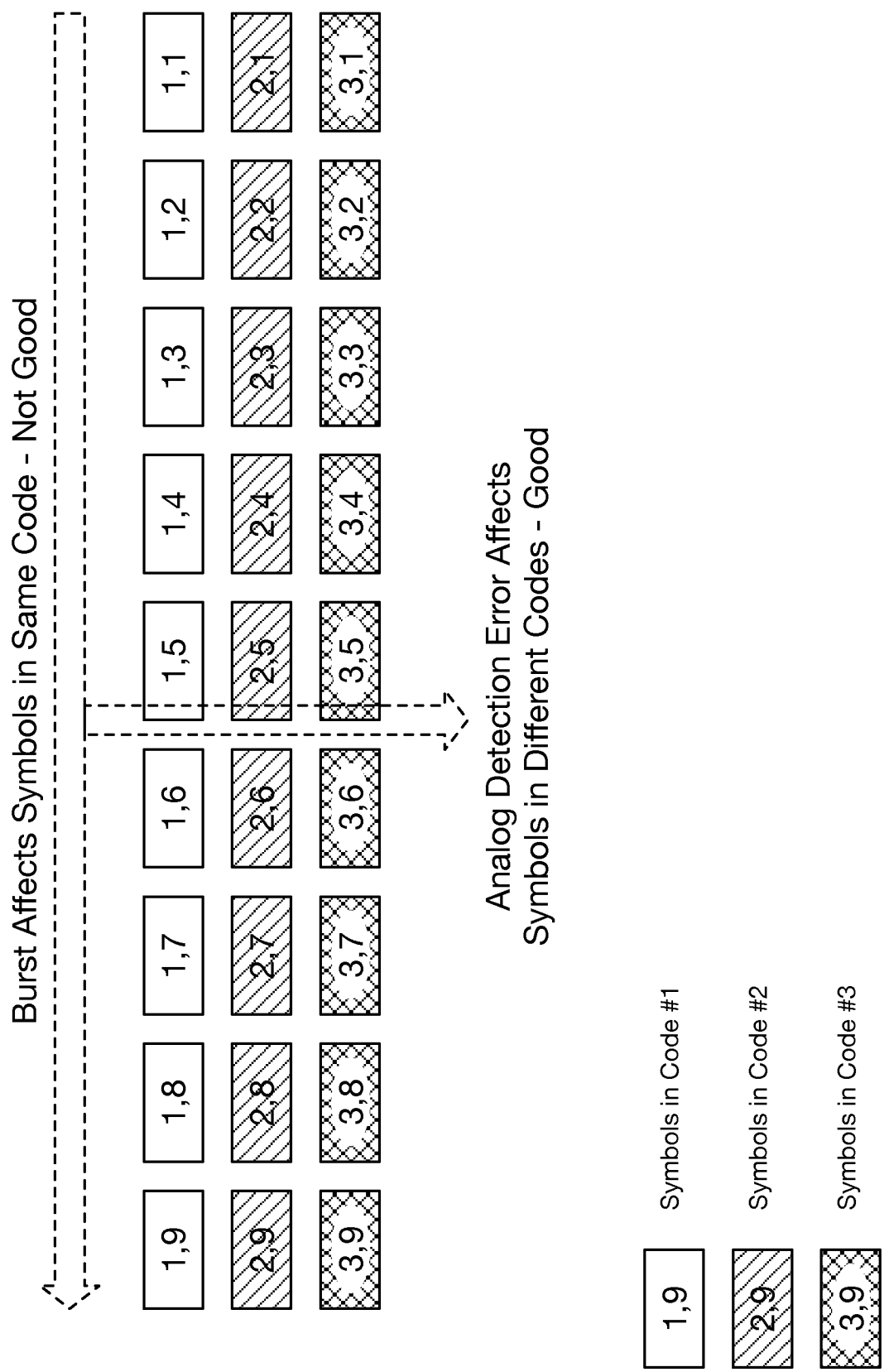
FIG. 7 illustrates three FEC protected data streams passed directly to three transport sub-channels, without permutation.

How this "dealing out" is performed has a significant impact on error containment. An obvious sequential ordering (i.e. allowing parallel streams of data to be transmitted on the three sub-channels) is equivalent to an embodiment having a fall-through or "no op" behavior of the Permuter function of FIG. 6. Such a sequence is shown in FIG. 7, where each sub-channel of the ENRZ code carries a respective stream of FEC-encoded data from a respective FEC encoder. Even with this simple sequential byte ordering within each sub-channel, potential errors in PHY analog detection (as may be caused by generalized faults) affects symbols in different sub-channels (e.g. in different FEC streams), which is a recoverable error. However, persistent weaknesses leading to burst errors in a single sub-channel may affect consecutive symbols in the same FEC-encoded stream, potentially overwhelming the sequential error correction ability of that sub-channel's FEC. Moreover, the sequential transmission of the relatively long FEC blocks leads to increased data latency, as the receiver cannot release a given data block until all of its contents have been received and its error detection values validated.

Figure 8:
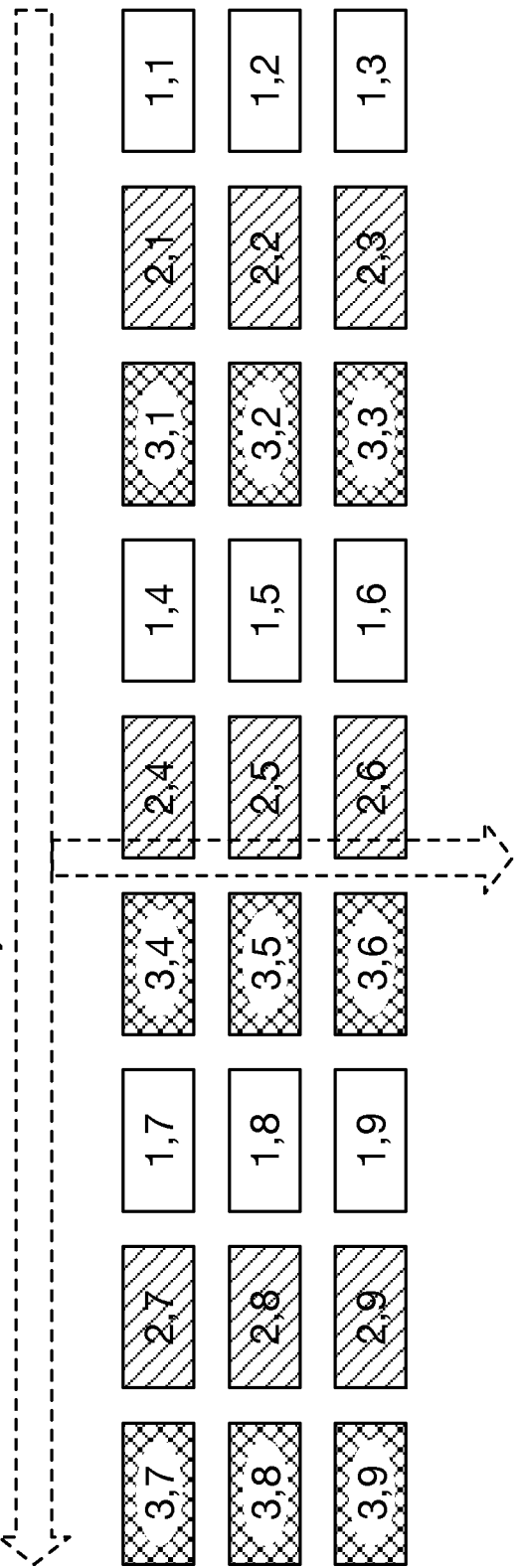
FIG. 8 illustrates three FEC protected data streams mapped in reoccurring order to three transport sub-channels.
Figure 8:
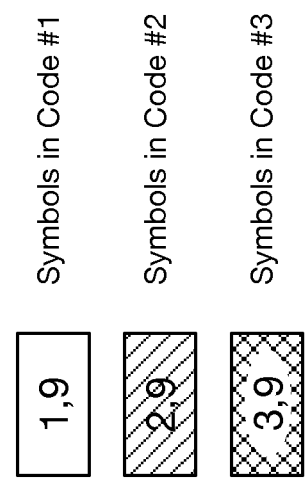

A second embodiment modifies the Permuter function of FIG. 6 to subdivide a given FEC-encoded stream of incoming bytes into groups of three bytes, which are then dealt out consistently in a "1, 2, 3" order to the three ENRZ sub-channels by simultaneously providing all three bytes to respective sub-channel encoders. As shown in FIG. 8, such a consistent interleaving significantly reduces the perceived data latency and provides increased robustness against burst errors in a single sub-channel. However, as consecutive bytes are now transmitted concurrently in the three sub-channels, there may be a potential for errors in analog detection affecting three symbols in the same code, leading to uncorrectable errors.

Figure 9:
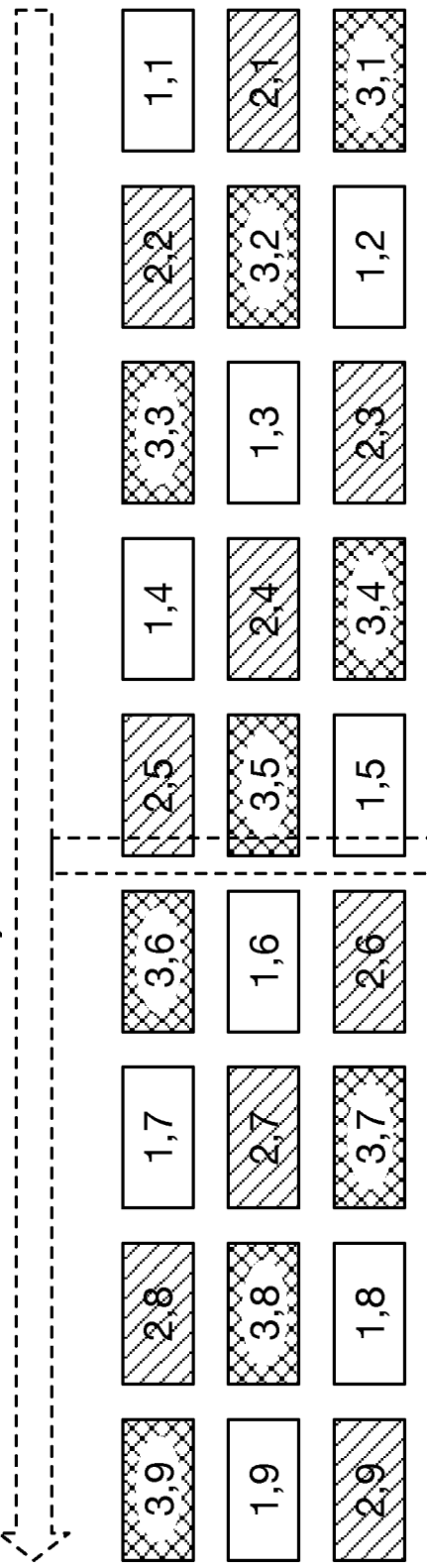
FIG. 9 illustrates three FEC protected data streams mapped in a cyclically varying order to three transport sub-channels.
Figure 9:
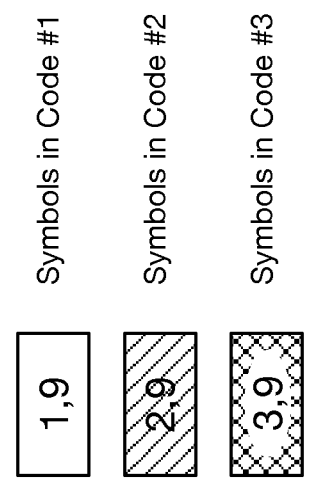

In at least one embodiment, the Permuter function of FIG. 6 cyclically permutes the order in which each group of e.g., three bytes is dealt out. As shown in FIG. 9, which byte of the three bytes is the first to be dealt out differs in each three-byte set of the three FEC-encoded streams. Such a permutation protects against both burst errors within a single sub-channel, and burst errors occurring across all sub-channels, while preserving the desirable latency reduction of the previous embodiment.

Permuter Embodiments

Figure 10:
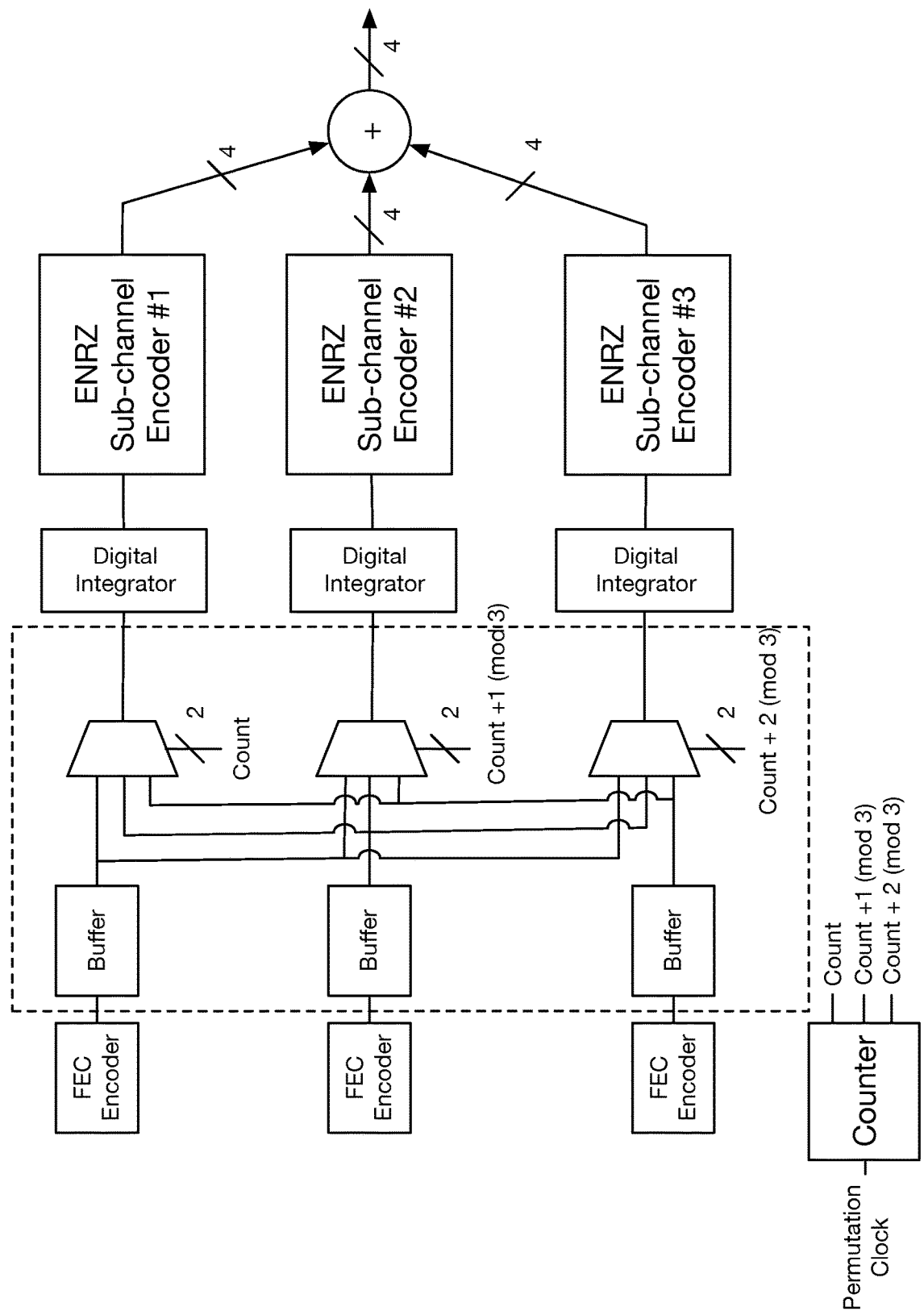
FIG. 10 shows one embodiment of a permuter subsystem.

FIG. 10 is a block diagram illustrating one implementation of the permuter shown in FIG. 6. As shown, the permuter includes a plurality of buffers configured to store streams of FEC-encoded bits from a respective FEC encoder of the plurality of FEC encoders. Each buffer may receive the stream of FEC-encoded bits pre-serialized from the FEC encoders, or may alternatively perform a serialization operation on FEC-encoded bits received in parallel. The permuter may further include a plurality of multiplexors configured to receive a stream of FEC-encoded bits from each buffer, and to responsively select which stream of FEC-encoded bits to provide to the corresponding digital integrators. As shown, each multiplexor receives a corresponding selection signal corresponding to staggered versions of a count signal provided by the counter. In the embodiment shown, the counter may be configurable to count 0, 1, 2, 0, 1, 2, and so on according to a (potentially modified) version of the permutation clock. The counter may thus provide three versions of the count signal including count, count+1 (mod 3), and count+2 (mod 3). As shown in FIG. 10, each count signal may be formatted as a pair of bits. Thus, as each multiplexor will receive a count signal being offset by 1 with respect to the other count signals, each sub-channel encoder will receive a bit or a stream of FEC-encoded bits (e.g., a multi-bit packet) from a different buffer when generating a given codeword or set of codewords of the vector signaling code. In some embodiments, the count signal "count" may increment once per byte of transferred data per destination, thus permuting the destination of the FEC encoded stream on byte intervals as illustrated in FIG. 9, while alternative embodiments may effectively increment the counter at a different granularity. The FEC-encoded streams may be provided to sub-channel encoders 1-3 via digital precoding integrators, as shown in FIG. 5A. Each sub-channel encoder may be configured to provide a respective weighted sub-channel vector that is weighted according to the received FEC-encoded stream, all weighted sub-channel vectors being summed to produce the symbols of the codeword to be transmitted via the multi-wire bus.

Figure 11:
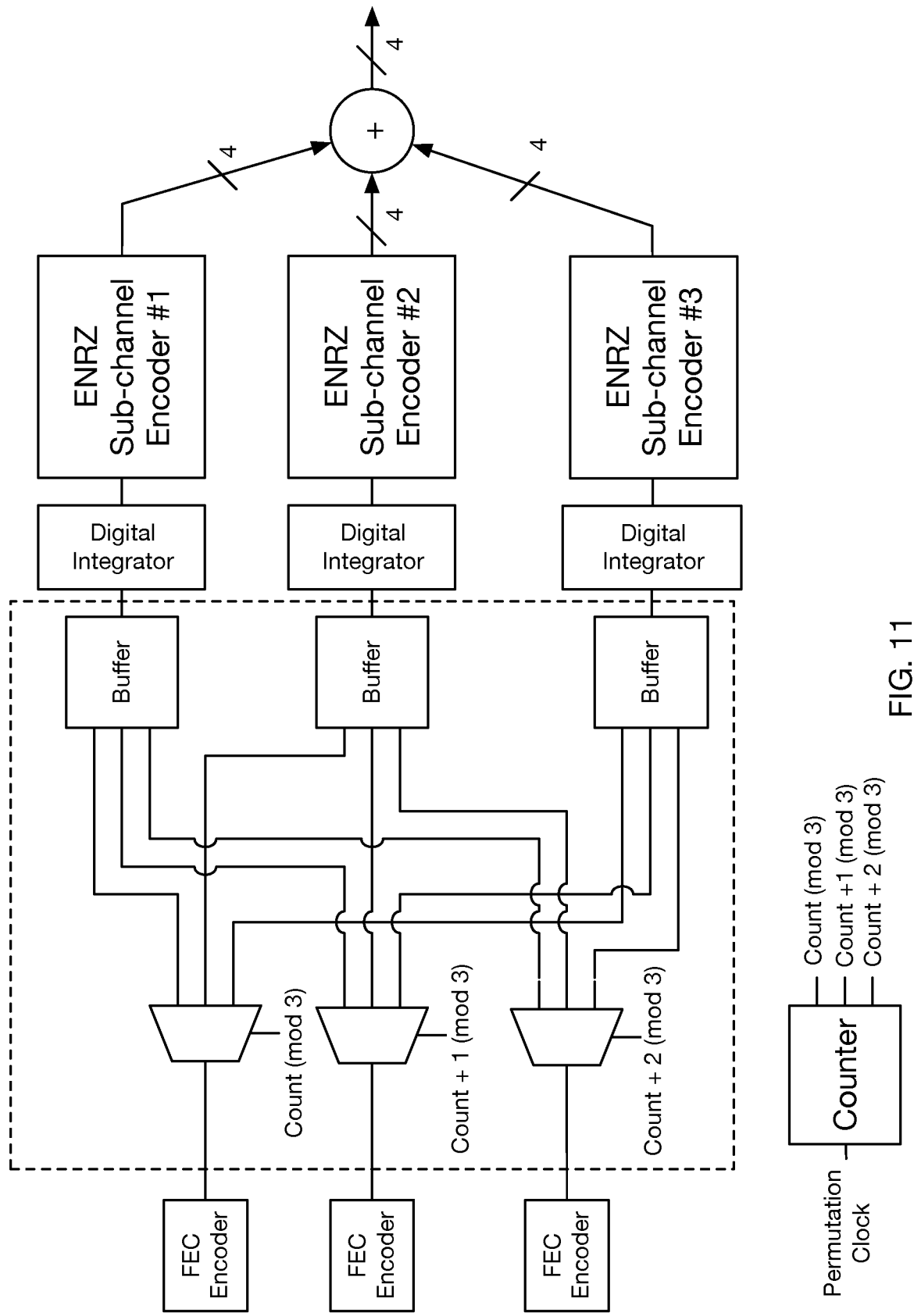
FIG. 11 shows another embodiment of a permuter subsystem.

FIG. 11 illustrates an alternative embodiment of a permuter. The permuter of FIG. 11 is similar to that of FIG. 10, however in FIG. 11, each FEC encoder is connected to a corresponding de-multiplexor that selects in which sub-channel specific buffer to store the stream of FEC-encoded bits. Similar to above, the selections may be performed according to staggered count signals in order to permute the destination of the bits provided to each buffer over time. The embodiments of FIGS. 10 and 11 illustrate only two possible embodiments in which the permuter may be implemented, and it should be noted alternative embodiments may be implemented through the use of logic gates in a field-programmable gate array (FPGA), for example, or software running on a processor that uses pointers to either read a stream from a buffer associated with an FEC encoder, or to write a stream from each FEC encoder to a sub-channel specific buffer. Further, a hardware description language may be used to generate a suitable circuit configuration.

Once each sub-channel encoder receives its respective stream (e.g., a byte, a multi-bit packer or in some embodiments a single bit) of FEC-encoded bits, the stream having been serialized for transmission by e.g., the FEC encoder or the buffer, each sub-channel encoder may generate a weighted sub-channel vector by e.g., modulating a corresponding sub-channel vector of a plurality of mutually orthogonal sub-channel vectors. A codeword of a vector signaling code is thus formed representing a weighted summation of the plurality of mutually orthogonal sub-channel vectors, the weight of each sub-channel vector being applied by a corresponding bit in the received serialized stream of FEC-encoded bits. FIGS. 10 and 11 illustrate the output of each sub-channel encoder being summed. In some embodiments, such a summation may be performed as an analog summation in the case each sub-channel encoder outputs an analog signal. Alternatively, each sub-channel encoder may generate and output one or more bits for controlling a multi-level driver to generate symbol values on the multi-wire bus, such as driver 240 in FIG. 2. In some embodiments, the codeword of the vector signaling code may be a permutation of $\pm[1, -\frac{1}{3}, -\frac{1}{3}, -\frac{1}{3}]$.

Figure 12:
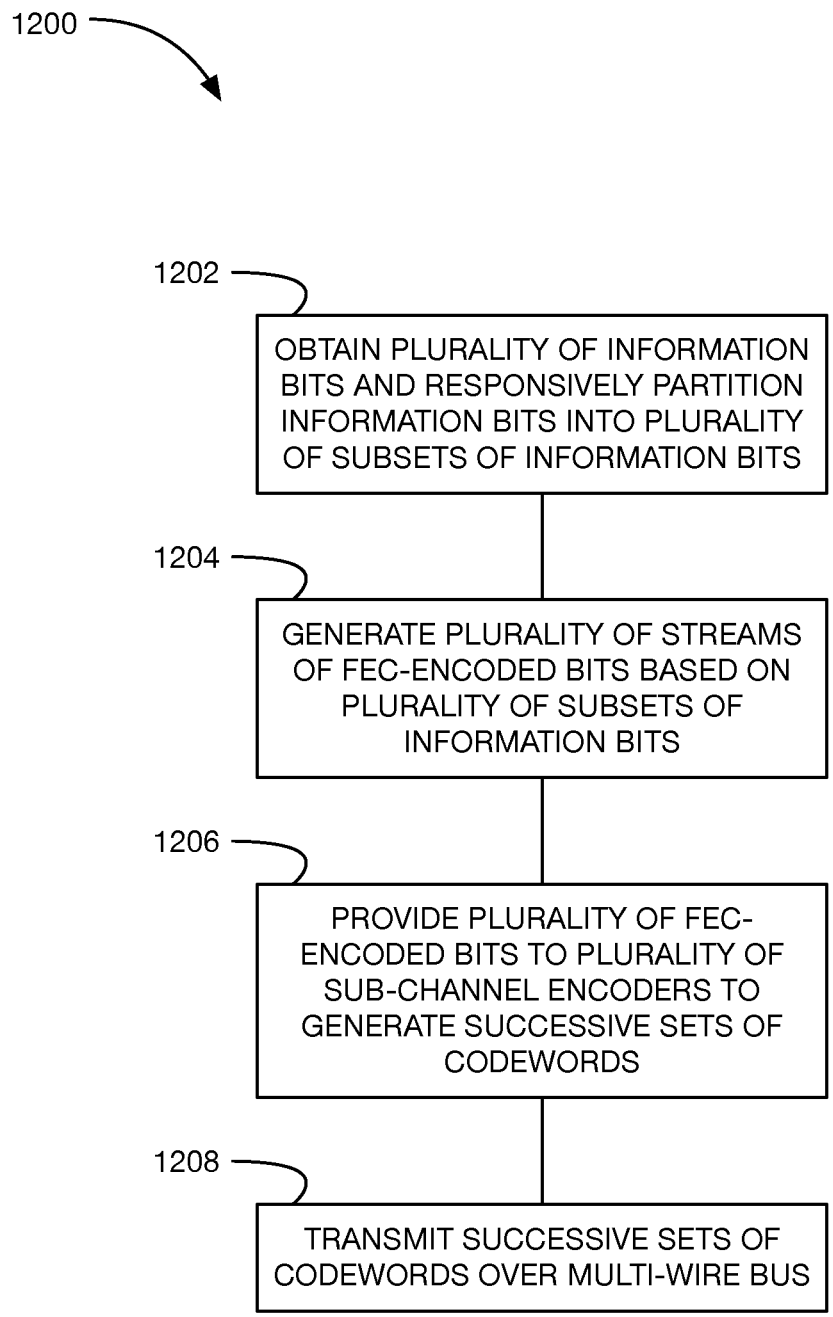
FIG. 12 is a flowchart of a method, in accordance with some embodiments.

FIG. 12 is a flowchart of a method 1200, in accordance with some embodiments. As shown, method 1200 includes obtaining a plurality of information bits 1202, and responsively partitioning the obtained plurality of information bits into a plurality of subsets of information bits. A plurality of FEC encoders generate 1204 a plurality of streams of forward error correction (FEC)-encoded bits, the plurality of FEC encoders receiving respective subsets of the plurality of subsets of information bits. The plurality of streams of FEC-encoded bits are provided 1206 to a plurality of sub-channel encoders for generating successive sets of codewords of a vector signaling code. Each sub-channel encoder receives a respective stream of FEC-encoded bits from a different FEC encoder of the plurality of FEC encoders for generating a set of codewords of a vector signaling code. Sequential streams of FEC-encoded bits from a given FEC encoder are provided to different sub-channel encoders for each successively generated set of codewords. The successively generated sets of codewords of the vector signaling code are transmitted 1208 over a multi-wire bus.

In some embodiments, each stream of FEC encoded bits corresponds to a multi-bit packet. Alternatively, each stream of FEC encoded bits may correspond to a single bit.

In some embodiments, generating each codeword of the set of codewords of the vector signaling code includes modulating mutually-orthogonal sub-channel vectors on the multi-wire bus according to the plurality of streams of FEC-encoded bits and responsively forming a summation of the modulated mutually-orthogonal sub-channel vectors.

In some embodiments, each stream of FEC encoded bits is provided to the corresponding sub-channel encoder using a corresponding multiplexor of a plurality of multiplexors, each multiplexor receiving all of the streams of FEC encoded bits and associated with a corresponding sub-channel encoder. Alternatively, each stream of FEC-encoded bits is selectively provided to the corresponding sub-channel encoder via a de-multiplexor of a plurality of de-multiplexors, each de-multiplexor associated with a corresponding FEC encoder.

In some embodiments, the plurality of streams of FEC encoded bits are buffered prior to providing the plurality of streams of FEC encoded bits to the plurality of sub-channel encoders.

In some embodiments, the sub-channel encoders are ENRZ sub-channel encoders.

In some embodiments, sequential streams of FEC-encoded bits are provided to corresponding sub-channel encoders according to respective count signals of a plurality of count signals, the plurality of count signals being staggered in time.

In some embodiments, each stream of FEC encoded bits is integrated prior to being provided to the corresponding sub-channel encoder.

Descriptive terms used herein such as "voltage" or "signal level" should be considered to include equivalents in other measurement systems, such as "current", "charge", "power", etc. As used herein, the term "signal" includes any suitable behavior and/or attribute of a physical phenomenon capable of conveying information. The information conveyed by such signals may be tangible and non-transitory.

Note that where various hardware elements of one or more of the described embodiments are referred to as "modules" that carry out (perform, execute, and the like) various functions that are described herein, a module includes hardware (e.g., one or more processors, one or more microprocessors, one or more microcontrollers, one or more microchips, one or more application-specific integrated circuits (ASICs), one or more field programmable gate arrays (FPGAs), one or more memory devices) deemed suitable by those of skill in the relevant art for a given implementation. Each described module may also include instructions executable for carrying out the one or more functions described as being carried out by the respective module, and those instructions may take the form of or include hardware (or hardwired) instructions, firmware instructions, software instructions, and/or the like, and may be stored in any suitable non-transitory computer-readable medium or media, such as commonly referred to as RAM or ROM.

Although features and elements are described above in particular combinations, one of ordinary skill in the art will appreciate that each feature or element may be used alone or in any combination with the other features and elements. In addition, the methods described herein may be implemented in a computer program, software, or firmware incorporated in a computer-readable medium for execution by a computer or processor. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

The invention claimed is:

1. A method comprising:
obtaining a plurality of information bits, and responsively generating a plurality of parallel forward error correction (FEC)-encoded data streams from the plurality of information bits;
generating an interleaved sequence of codewords from the plurality of parallel FEC-encoded data streams, each codeword generated by a weighted summation of a plurality of mutually orthogonal sub-channel vectors, each sub-channel vector weighted by a corresponding FEC-encoded stream of the plurality of parallel FEC-encoded streams, wherein the plurality of parallel FEC-encoded streams are permuted to weight different sub-channel vectors after a predetermined number of consecutively generated codewords; and transmitting each codeword of the interleaved sequence of codewords over a plurality of wires of a multi-wire bus.

2. The method of claim 1, wherein the plurality of parallel FEC-encoded streams are permuted to weight different sub-channel vectors after every consecutively generated codewords.

3. The method of claim 1, wherein the plurality of parallel FEC-encoded streams are permuted to weight different sub-channel vectors after at least two consecutively generated codewords.

4. The method of claim 1, wherein the plurality of parallel FEC-encoded streams are cyclically permuted amongst the plurality of mutually orthogonal sub-channel vectors.

5. The method of claim 4, wherein weighting each mutually orthogonal sub-channel vector comprises selecting the corresponding FEC-encoded stream as an input to a respective sub-channel encoder of a plurality of sub-channel encoders.

6. The method of claim 5, wherein the corresponding FEC-encoded stream is selected via a multiplexer having an output connected to the respective sub-channel encoder, and wherein each FEC-encoded stream is provided as an input connected to the multiplexer.

7. The method of claim 6, wherein the multiplexer receives a selection signal from a counter.

8. The method of claim 5, wherein the corresponding FEC-encoded stream is selected as an output on a demultiplexer receiving the corresponding FEC-encoded stream as an input and having a plurality of outputs connected to the plurality of sub-channel encoders.

9. The method of claim 5, wherein each stream of FEC encoded bits is further integrated prior to being provided to the respective sub-channel encoder.

10. The method of claim 1, wherein the plurality of mutually orthogonal sub-channel vectors are ensemble non-return-to-zero (ENRZ) sub-channel vectors.

11. An apparatus comprising:
a plurality of FEC-encoders configured to obtain a plurality of information bits, and to responsively generate a plurality of parallel forward error correction (FEC)-encoded data streams from the plurality of information bits;

a plurality of sub-channel encoders configured to generate an interleaved sequence of codewords from the plurality of parallel FEC-encoded data streams, each codeword generated by a weighted summation of a plurality of mutually orthogonal sub-channel vectors, each sub-channel encoder receiving a corresponding FEC-encoded stream of the plurality of parallel FEC-encoded streams;

a permuter configured to permute each of the plurality of parallel FEC-encoded streams to a different sub-channel encoder after a predetermined number of consecutively generated codewords; and a plurality of drivers configured to transmit each codeword of the interleaved sequence of codewords over a plurality of wires of a multi-wire bus.

12. The apparatus of claim 11, wherein the permuter is configured to permute each FEC-encoded stream after every consecutively generated codewords.

13. The apparatus of claim 11, wherein the permuter is configured to permute each FEC-encoded stream after at least two consecutively generated codewords.

14. The apparatus of claim 11, wherein the permuter is configured to cyclically permute the plurality of parallel FEC-encoded streams amongst the plurality of sub-channel encoders.

15. The apparatus of claim 14, wherein the permuter comprises a plurality of multiplexers, each multiplexer connected to an input of a respective sub-channel encoder and configured to receive the plurality of parallel FEC-encoded streams and to select one of the FEC-encoded streams as the input to the respective sub-channel encoder.

16. The apparatus of claim 15, wherein each multiplexer is configured to receive a corresponding selection signal from a counter.

17. The apparatus of claim 16, wherein the selection signals are staggered with respect to each other.

18. The apparatus of claim 14, wherein the permuter comprises a plurality of demultiplexers, each demultiplexer configured to receive a corresponding FEC-encoded stream and to provide the corresponding FEC-encoded stream to an input of a corresponding sub-channel encoder.

19. The apparatus of claim 14, further comprising an integrator configured to integrate each stream of FEC encoded bits prior to being provided to the respective sub-channel encoder.

20. The apparatus of claim 11, wherein the plurality of sub-channel encoders are ensemble non-return-to-zero (ENRZ) sub-channel encoders.

* * * * *